(12) United States Patent
Kuo

(10) Patent No.: US 8,304,755 B2
(45) Date of Patent: Nov. 6, 2012

(54) THREE-DIMENSIONAL SEMICONDUCTOR STRUCTURE

(75) Inventor: Ming-Chang Kuo, Changhua County (TW)

(73) Assignee: Macronix International Co., Ltd., Hsinchu (TW)

(*) Notice: Subject to any disclaimer, the term of this patent is extended or adjusted under 35 U.S.C. 154(b) by 177 days.

(21) Appl. No.: 12/372,860

(22) Filed: Feb. 18, 2009

(65) Prior Publication Data
US 2010/0208503 A1 Aug. 19, 2010

(51) Int. Cl.
*H01L 47/00* (2006.01)

(52) U.S. Cl. .................................. 257/4; 257/5

(58) Field of Classification Search .............. 257/2–5, 257/E31.001, E31.027, E31.028, E31.029
See application file for complete search history.

(56) References Cited

U.S. PATENT DOCUMENTS

| | | | |
|---|---|---|---|
| 6,778,421 B2* | 8/2004 | Tran | 365/105 |
| 2003/0174530 A1 | 9/2003 | Tran | |
| 2007/0190722 A1* | 8/2007 | Herner | 438/257 |

OTHER PUBLICATIONS

Chinese language office action dated Mar. 30, 2011.

* cited by examiner

*Primary Examiner* — Hung Vu
(74) *Attorney, Agent, or Firm* — McClure, Qualey & Rodack LLP

(57) ABSTRACT

A three-dimensional (3D) semiconductor structure with high density and method of fabricating the same are disclosed. The 3D semiconductor structure comprises at least a first memory cell and a second memory cell stacked on the first memory cell. The first memory cell comprises a first conductive line and a second conductive line. The second memory cell comprises another first conductive line opposite to the first conductive line of the first memory cell, and the second conductive line formed between said two first conductive lines of the first and second memory cells. The first and second memory cells share the second conductive line when the 3D semiconductor structure is programming and erasing, and each of the first and second memory cells has a diode.

7 Claims, 10 Drawing Sheets

THREE-DIMENSIONAL SEMICONDUCTOR STRUCTURE

BACKGROUND OF THE INVENTION

1. Field of the Invention

The invention relates in general to a three-dimensional (3D) semiconductor structure and method of fabricating the same, and more particularly to the three-dimensional resistive random-access memory (RRAM) structure and method of fabricating the same.

2. Description of the Related Art

Integrated circuits are used to control the functions of many modern electronic devices. Memory devices used for storing (write) and retrieving (read) data possess advantages that are easily accessible by the integrated circuits. Various types of memory devices for data storage are known in the art. Generally, memory devices are distinguished by their speed and data retention characteristic.

Memory device falls mainly into two classes: random access memory ("RAM") and read-only memory ("ROM"). Many improvements and variations of RAMs and ROMs have been advanced to further their performance, and both types of memory have their own advantages and disadvantages. Typically, RAM (i.e. volatile) has fast data transfer rates and efficient writing architectures, but requires continuously power to keep the data. ROM retains the contents even in the absence of power, but is limited in the speed, the number of times to which it may be written, and the manner in which it may be written. ROM mostly comprises Flash memory, EPROM, OTP, EEPROM, and PROM. RAM mostly comprises static RAM (SRAM), dynamic RAM (DRAM).

Static random access memory (SRAM), with very fast access times, retains a value as long as power is supplied. However, its volatility (i.e. it will lose its contents when the power is switched off), large size and stand-by current limit the total size and applications of the memory. DRAM has the smallest cell size, but necessitates a complex refresh algorithm, and is also necessary to supply voltage at all times or the information will disappear (i.e. volatile). Flash memory (i.e. non-volatile memory) is slower to program, and in some cases must erase a large block of memory before being reprogrammed.

Resistive random access memory (RRAM) is a new non-volatile memory type being developed by many companies for a period of time. Different forms of RRAM have been disclosed, based on different dielectric materials, spanning from perovskites to transition metal oxides to chalcogenides. Literature data are giving more indications that RRAM is closest to becoming a universal memory. For, example, RRAM operates at a faster timescale (switching time can be less than 10 ns), and has a simpler smaller cell structure (a 4-8 $F^2$ MIM stack). Compared to flash memory, a lower voltage is sufficient. Compared to DRAM, the data is retained longer (10 years).

Memory devices can be constructed into two-dimensional (2D) cell array or three-dimensional (3D) memory array, wherein the 2D memory cells are matrixed in the X-Y plane. The 3D memory device includes a plurality of stacked memory cells to form a three-dimensional memory array. The three-dimensional memory device is most efficient when the number of cell on each bit line and word line is large. FIG. 1 depicts a cross-sectional view of one conventional three-dimensional (3D) memory device. As shown in FIG. 1, the 3D memory device 1 has two stacked memory cell arrays 10A and 10B. Nevertheless, the 3D memory device may have any number of stacked memory cell arrays. Although each stacked memory cell array of FIG. 1 includes two memory cell units, it could have more for meet the requirement of high density of memory cells. Therefore, the 3D memory device density could be increased in the vertical direction (i.e. z-direction) and also along the x-y plane.

As shown in FIG. 1, the stacked memory cell array 10B is supported by a base layer 11 made of insulation material, such as oxide, nitride, silicon dioxide, or other like insulation materials. The base layer 11 could be formed on a substrate (not shown), in which the base layer 11 and the substrate would support the stacked memory cell arrays 10A and 10B. Each memory cell array includes the plugs formed on the first conductive line (ex. word line) 12 and the plugs are spaced apart by a first insulation layer 16. Each plug includes a metal layer 13 and a metal oxide layer 14. The metal oxide layer 14 acts as a memory element while the cell is programming and erasing. The second conductive lines (ex. bit lines) 18 are formed on the metal oxide layer 14, and the y-direction second conductive lines (ex. bit lines) 18 are orthogonal to a top layer of the x-direction first conductive line (ex. word line) 12. Also, a second insulation layer 19 is formed on the second conductive lines 18. The stacked memory cell arrays 10A and 10B are separated from each other by the second insulation layer 19. During device operation, the conventional memory cell arrays 10A and 10B, which have identical structures, function as two independent units. For example, the programming of the cell of stacked memory cell arrays 10B can be achieved by applying voltages on the first conductive line (ex. word line) 12 and second conductive lines (ex. bit lines) 18. The resistance of the metal oxide layer 14 would be changed by applying different levels of voltage, and variable resistance of the metal oxide layer 14 define different logic states of memory cell. Similarly, the programming of the cell of stacked memory cell arrays 10A, which is independent from the memory cell arrays 10B, can be achieved by applying voltages on the first conductive line 12' and the second conductive lines 18'.

Although various structures of 3D memory devices have been developed, each stacked memory array of a conventional 3D memory device is programmed by applying voltages on its own word lines and bit lines. Thus, the stacked memory arrays of the conventional 3D memory device are programmed individually. Despite various 3D memory devices have been investigated and known in worldwide memory technologies, it is still desirable to fabricate a high density 3D memory device with more components packed onto each chip for meeting the future needs of smaller electronic product.

SUMMARY OF THE INVENTION

It is therefore an object of the present invention to provide a three-dimensional (3D) semiconductor device, especially a high-density 3D resistive random-access memory (RRAM) structure, fabricated by a simple and low-cost method.

According to the first aspect of the invention, the above-identified object is achieve by providing a 3D semiconductor structure, comprising at least a first memory cell and a second memory cell stacked on the first memory cell. The first memory cell comprises a first conductive line and a second conductive line. The second memory cell comprises another first conductive line opposite to the first conductive line of the first memory cell, and the second conductive line formed between said two first conductive lines of the first and second memory cells. The first and second memory cells share the second conductive line when the 3D semiconductor structure is programming and erasing. Also, each of the first and second memory cells has a diode.

According to the second aspect of the invention, the above-identified object is achieve by providing a method of manufacturing three-dimensional (3D) semiconductor structure, comprising at least steps of forming a first memory cell and forming a second memory cell on the first memory cell. The steps of manufacturing the first memory cell comprises forming a first conductive line; forming a first metal layer on the first conductive line; forming a first metal oxide layer on the first metal layer; and forming a second conductive line on the first metal oxide layer. The steps of manufacturing the second memory cell comprises forming a second metal layer on the second conductive line; forming a second metal oxide layer on the second metal layer; and forming another first conductive line on the second metal oxide layer, and opposite to the first conductive line of the first memory cell, wherein the second conductive line is formed between said two first conductive lines of the first and second memory cells, and shared by the first and second memory cells when the 3D semiconductor structure is programming and erasing. Also, each of the first and second memory cells has a diode.

According to the third aspect of the invention, the above-identified object is achieve by providing another 3D semiconductor structure, comprising at least a first memory cell and a second memory cell stacked on the first memory cell. The first memory cell comprises a first bit line and a word line. The second memory cell stacked on the first memory cell comprises: a second bit line opposite to the first bit line of the first memory cell, and the word line formed between the first bit line of the first memory cell and the second bit line of the second memory cell. The first bit line of the first memory cell and the second bit line of the second memory cell shares the word line disposed therebetween when the 3D semiconductor structure is programming and erasing.

According to the fourth aspect of the invention, the above-identified object is achieve by providing another 3D semiconductor structure, comprising at least a first memory cell and a second memory cell stacked on the first memory cell. The first memory cell comprises a first word line and a bit line. The second memory cell stacked on the first memory cell comprises: a second word line opposite to the first word line of the first memory cell, and the bit line formed between the first word line of the first memory cell and the second word line of the second memory cell. The first word line of the first memory cell and the second word line of the second memory cell shares the bit line disposed therebetween when the 3D semiconductor structure is programming and erasing.

Other objects, features, and advantages of the present invention will become apparent from the following detailed description of the preferred but non-limiting embodiment. The following description is made with reference to the accompanying drawings.

DETAILED DESCRIPTION OF THE INVENTION

In the present invention, a three-dimensional (3D) semiconductor structure, particularly a 3D resistive random-access memory (RRAM) structure, and method of fabricating the same are disclosed. The 3D semiconductor structure of the present invention has at least two memory cells stacked vertically and both of memory cells share a conductive line formed therebetween when the 3D semiconductor structure is programming and erasing. According to the present invention, a high-density 3D semiconductor structure is disclosed and fabricated by a simple and low-cost method. Also, diode elements are preferably formed into the memory cells of the 3D semiconductor structure according to the embodiment, for controlling the amounts and flowing direction of current.

Four embodiments are provided for demonstrating the 3D semiconductor structures of the present invention. The first and second embodiments illustrate different positions of the diode elements disposed in the 3D semiconductor structures, wherein each memory cell of the 3D semiconductor structures has one memory element. The 3D semiconductor structures illustrated in the third and fourth embodiments are similar to that of the first and second embodiments, but each memory cell thereof has two memory elements. However, each 3D semiconductor structures may have any number of memory cells stacked vertically, and each memory cell may have any number of memory elements. Thus, those embodiments illustrate different applicable designs of 3D semiconductor structures of the present invention. The embodiments disclosed herein are used for illustrating the invention, but not for limiting the scope of the invention.

Moreover, some basic techniques, such as formation of P-doped region, N-doped region, etching, oxide deposition, metal oxidation, etc., are known by one skilled in the field of the invention and won't be illustrated in detail. Also, it is known for people skill in the art that the 3D semiconductor structure presented in the embodiments and drawings could be slightly modified under the spirit of the invention. The specification and the drawings are to be regard as an illustrative sense rather than a restrictive sense. Additionally, the drawings used for illustrating the embodiments and applications of the present invention only show the major characteristic parts in order to avoid obscuring the present invention.

Each Memory Cell of 3D Semiconductor Structure Including One Memory Element

First Embodiment

Figure 1:
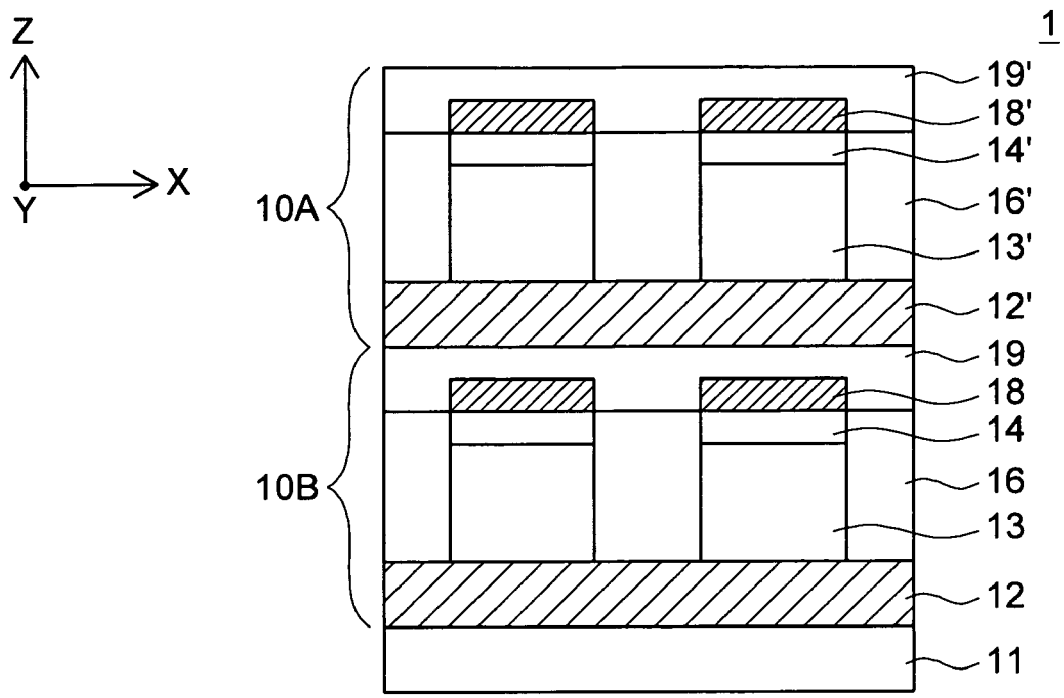
FIG. 1 depicts a cross-sectional view of one conventional three-dimensional (3D) memory device.
Figure 2:
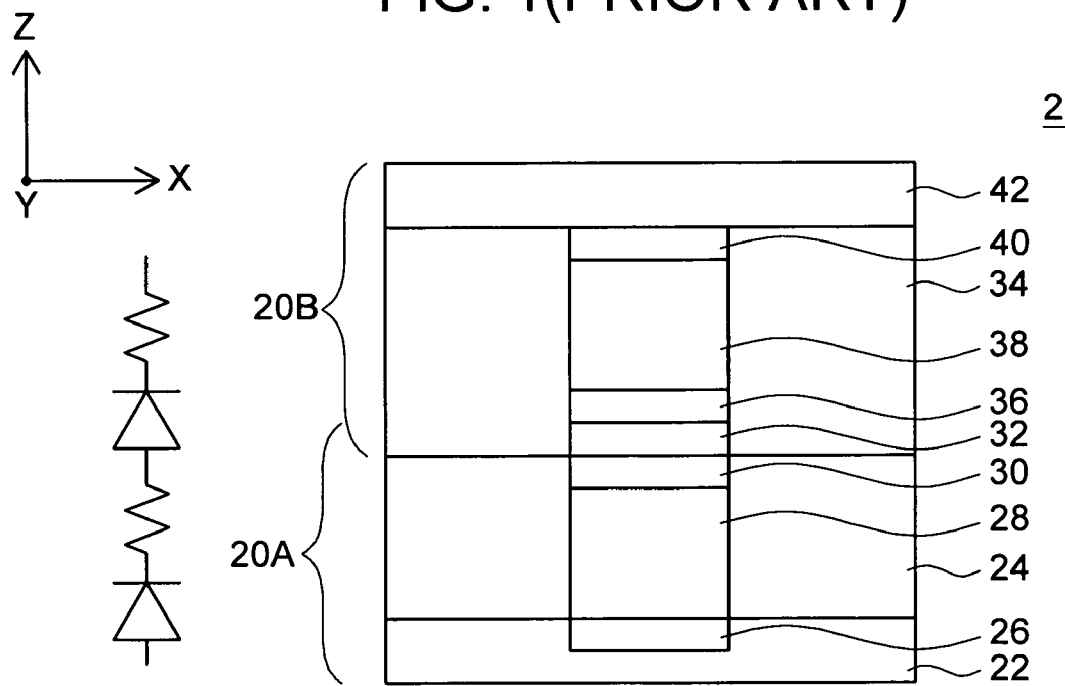
FIG. 2 schematically shows a cross-sectional view of a three-dimensional (3D) semiconductor structure according to the first embodiment of the present invention.

FIG. 2 schematically shows a cross-sectional view of a three-dimensional (3D) semiconductor structure according to the first embodiment of the present invention. As shown in FIG. 2, the 3D semiconductor structure 2 is constructed by vertically stacking at least two memory cells 20A and 20B, and the second memory cell 20B is stacked on the first memory cell 20A. The first memory cell 20A could be supported by a base layer (not shown) made of insulation material. Alternatively, the base layer is formed on a substrate (not shown), in which the base layer and the substrate support the 3D semiconductor structure 2.

The first memory cell 20A includes a first conductive line 22, a first doped region 26, a first metal layer 28, a first metal oxide layer 30, and a second conductive line 32 opposite to the first conductive line 22. The first conductive line 22 and the second conductive line 32 could be the P-type conductive lines. The first doped region 26, such as a N-doped region, is formed in the first conductive line 22. The first metal layer 28 is formed on the first doped region 26, and the first metal oxide layer 30 is formed on the first metal layer 28. The second conductive line 32 is formed on the first metal oxide layer 30. Also, the second conductive line 32 is orthogonal to a top of the first conductive line 22. Furthermore, the P-type first conductive line 22 and the first N-doped region 26 formed thereon function as a diode element, for controlling the amounts and flowing direction of current when the first memory cell 20A is operated.

Similarly, the second memory cell 20B, stacked on the first memory cell 20A, includes the second conductive line 32, a second doped region 36, a second metal layer 38, a second metal oxide layer 40, and the first conductive line 42. The second doped region 36, such as a N-doped region, is formed on the second conductive line 32. The second metal layer 38 is formed on the second doped region 36, and the second metal oxide layer 40 is formed on the second metal layer 38. The first conductive line 42 of the second memory cell 20B is formed on the second metal oxide layer 40. Also, the first conductive line 42 is orthogonal to a top of the second conductive line 32. Furthermore, the P-type second conductive line 32 and the second N-doped region 36 formed thereon function as a diode element, for controlling the amounts and flowing direction of current when the second memory cell 20B is operated.

Moreover, the first metal oxide layer 30 and the second metal oxide layer 40 act as the memory elements while the first memory cell 20A and the second memory cell 20B are programming. The resistances of the metal oxides (i.e. the first metal oxide layer 30 and the second metal oxide layer 40) would be changed by applying different levels of voltage, and the memory cells (i.e. the first memory cell 20A and the second memory cell 20B) are resistive random access memory (RRAM) cells. Variable resistances of the metal oxide define different logic states of the memory cell correspondingly.

Structurally, the second conductive line 32 is formed between the first conductive line 22 of the first memory cell 20A and the first conductive line 42 of the second memory cell 20B, as shown in FIG. 2. The programming of the first memory cell 20A is achieved by applying voltages on the first conductive line (ex. word line) 22 and the second conductive line (ex. bit line) 32. The programming of the second memory cell 20B is achieved by applying voltages on the first conductive line (ex. word line) 42 and the second conductive line (ex. bit line) 32. Thus, the first and second memory cells 20A and 20B would share the second conductive line 32 during operation of the 3D semiconductor structure 2. In practical application, the first conductive line 22 of the first memory cell 20A and the first conductive line 42 of the second memory cell 20B could be word lines, and the second conductive line 32 could be bit line, wherein two word lines share one bit line during operation of the 3D semiconductor structure 2. Alternatively, the first conductive line 22 of the first memory cell 20A and the first conductive line 42 of the second memory cell 20B could be bit lines, and the second conductive line 32 could be word line, wherein two bit lines share one word line during operation of the 3D semiconductor structure 2.

Although the 3D semiconductor structure 2 of FIG. 2 includes two memory cells, it is known in the art that the 3D memory device may have any number of stacked memory cells along the Z-direction, and the number of memory cells matrixed in the X-Y plane could be increased, thereby increasing the cell density of the structure in the vertical direction (i.e. z-direction) and also along the x-y plane for meeting the requirements of practical application. Thus, a memory device may include several repeat units of the semiconductor structure 2 arranged in a 3D matrix.

It is further noted that the first conductive lines 22 and 42 could be P-type word lines, and the second conductive line 32 could be a P-type bit line functioning as a common bit line for the first memory cell 20A and the second memory cell 20B. Alternatively, the first conductive lines 22 and 42 could be P-type bit lines, and the second conductive line 32 could be a P-type word line functioning as a common word line shared by the first memory cell 20A and the second memory cell 20B. Operation of the memory cells and the common conductive lines thereof would be optionally determined according to the practical applications, and the present invention has no particular limitation herein.

The method of fabricating the 3D semiconductor structure of FIG. 2 will now be explained with reference to FIG. 3A~FIG. 3L. FIG. 3A~FIG. 3L illustrate a method of fabricating the 3D semiconductor structure of the first embodiment in the present invention.

Figure 3A:
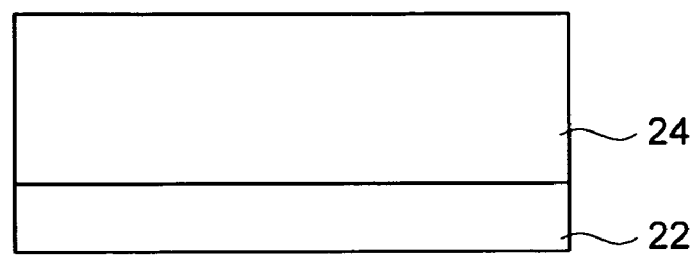
FIG. 3A~FIG. 3L illustrate a method of fabricating the 3D semiconductor structure of the first embodiment in the present invention.
Figure 3B:
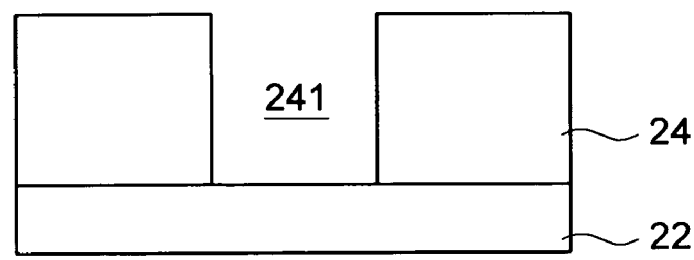

Referring to FIG. 3A, a first conductive line 22 on which an insulation layer such as a first oxide layer 24 has been formed is provided. The first conductive line 22 may include P-type conductive material. The first oxide layer 24 could be formed on the first conductive line 22 by any known deposition method. The first oxide layer 24 is patterned to expose partial area of the first conductive line 22 and form a hole 241 therein, as shown in FIG. 3B. The first oxide layer 24 could be patterned by an etching process.

Figure 3C:
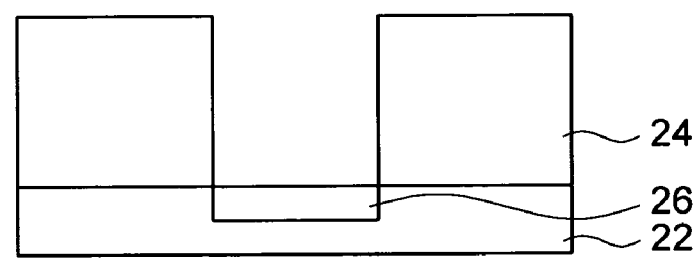
Figure 3D:
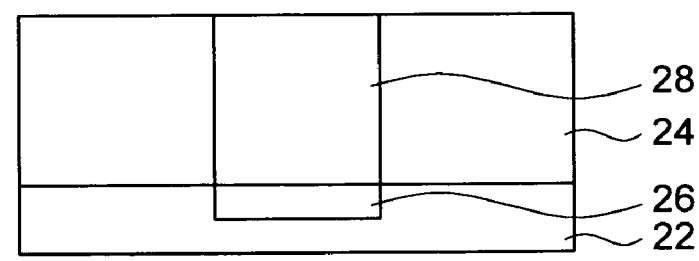

Referring to FIG. 3C, the first conductive line 22 is doped to form a first doped region 26, such as a N-doped region. For example, the first conductive line 22 could be doped by ion implantation process. Also, the first doped region 26 is corresponding to the exposed area of the first conductive line 22 of FIG. 3B. A conductive layer such as metal is deposited over the first oxide layer 24 and on the exposed area of the first conductive line 22, to fill in the hole 241, and then planarized to form a first metal layer 28 as shown in FIG. 3D. The first metal layer 28 and the first oxide layer 24 could be planarized by using only a chemical mechanical polish (CMP) process, or using only a dry etching process, or using a combination of CMP and dry etching processes.

Figure 3E:
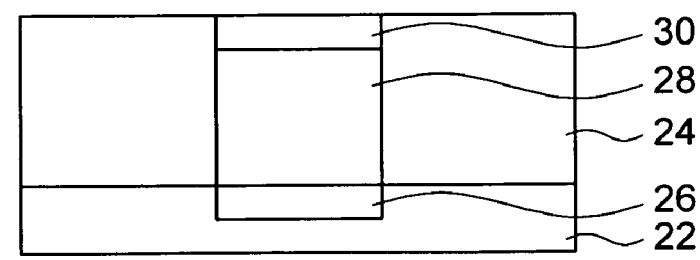
Figure 3F:
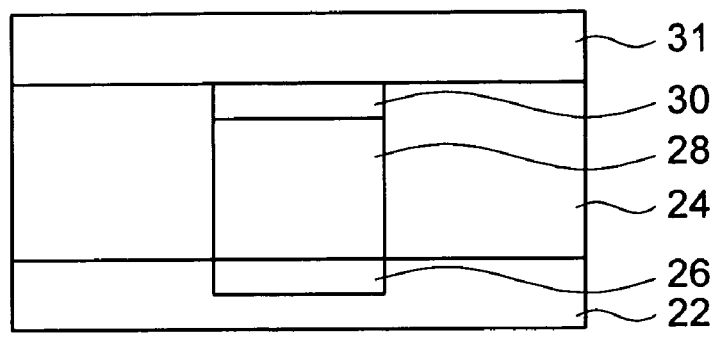

Referring to FIG. 3E, a first metal oxide layer 30 is formed on the first metal layer 28 by any known methods, such as thermal oxidation or plasma oxidation. Also, the upper surfaces of the first oxide layer 24 and the first metal oxide layer 30 are coplanar. A conductive layer 31 is then deposited over the first metal oxide layer 30 and the first oxide layer 24, as shown in FIG. 3F. The first metal oxide layer 30 may include tungsten oxide (WOx), Nickel Oxide (NiO), Niobium Oxide ($Nb_2O_5$), Copper Oxide ($CuO_2$), Tantalum Oxide ($Ta_2O_5$), Aluminum Oxide ($Al_2O_3$), Cobalt Oxide (CoO), Ferric Oxide ($Fe_2O_3$), Hafnium Oxide ($HfO_2$), Titanium Dioxide ($TiO_2$), Strontium Titanate ($SrTiO_3$), Strontium Zirconate ($SrZrO_3$), Barium Strontium Titanate (($BaSr)TiO_3$), Germanium Titanium (GeTi), Tin manganese telluride (SnMnTe), Antimony Tellurium (SbTe), $Pr_{1-x}Ca_xMnO_3$, or other like materials. In some cases, the metal oxide materials may be replaced by the phase change materials.

Figure 3G:
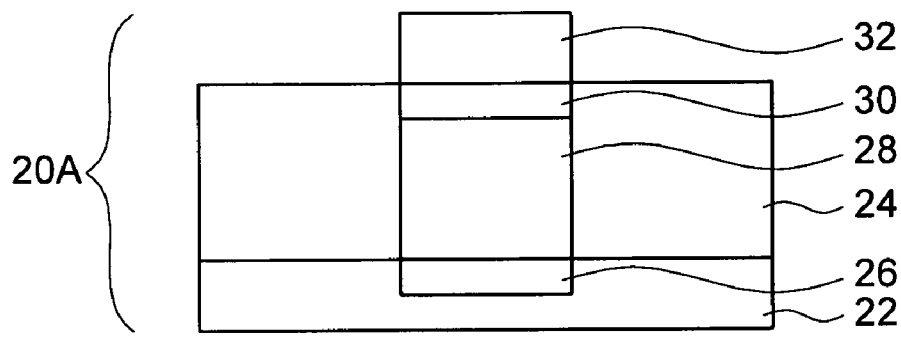

Subsequently, the conductive layer 31 is patterned to form a second conductive line 32 on the first metal oxide layer 30, and a width of the second conductive line 32 is substantially equal to the width of the first metal oxide layer 30, as shown in FIG. 3G. The conductive layer 31 could be patterned by an etching process. The second conductive line 32 may also include P-type conductive material.

Figure 3H:
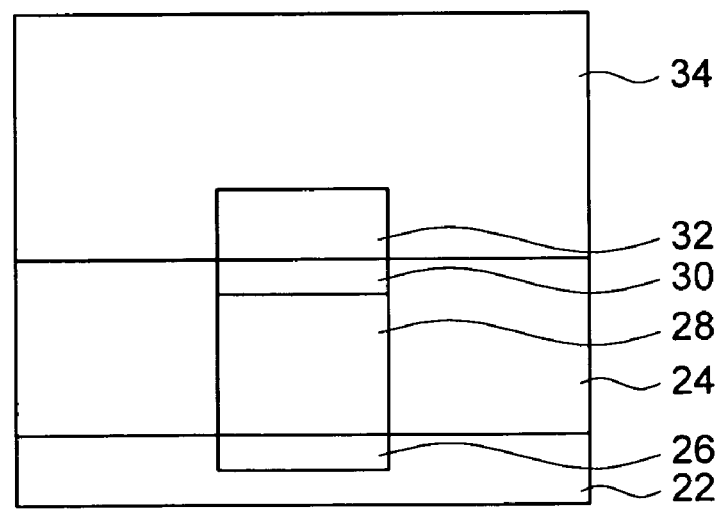
Figure 3I:
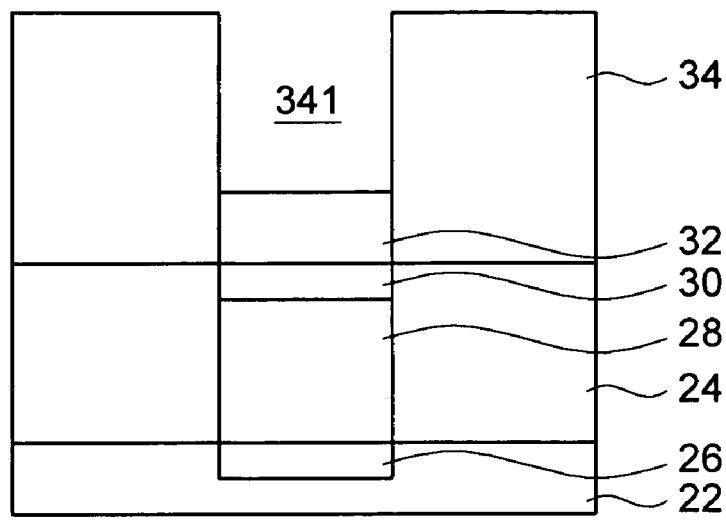

Referring to FIG. 3H, a second oxide layer 34 is deposited on the second conductive line 32. The second oxide layer 34 is patterned to expose partial area of the second conductive line 32 and form a hole 341 therein, as shown in FIG. 3I. The second oxide layer 34 could be patterned by an etching process.

Figure 3J:
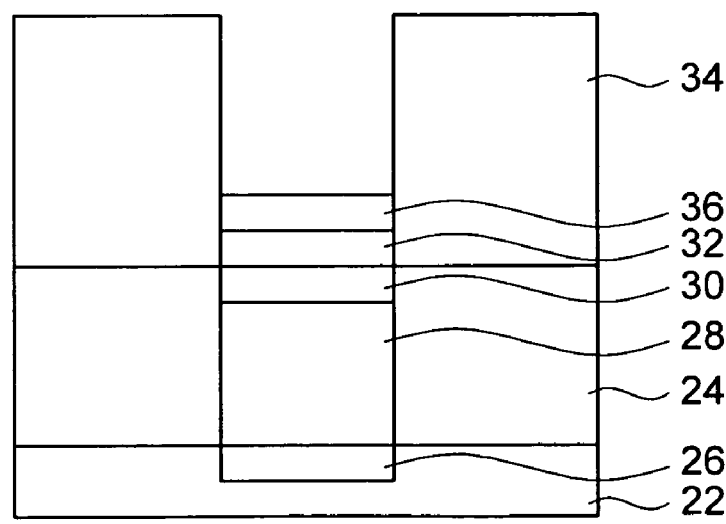
Figure 3K:
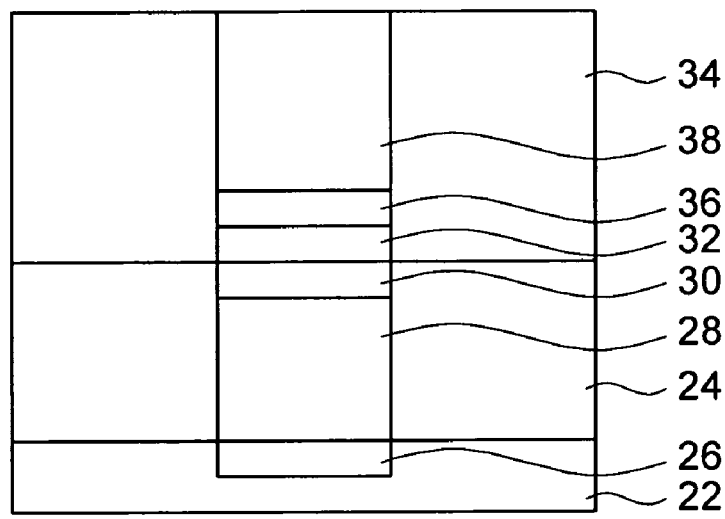

Referring to FIG. 3J, the second conductive line 32 is doped to form a second doped region 36, such as N-doped region. For example, the second conductive line 32 could be doped by ion implantation process. Also, the second doped region 36 is corresponding to the exposed area of the second conductive line 32 of FIG. 3I. A conductive layer such as metal is deposited over the second oxide layer 34 and on the exposed area of the second conductive line 32, to fill in the hole 341, and then planarized to form a second metal layer 38 as shown in FIG. 3K. The second metal layer 38 and the second oxide layer 34 could be planarized by using only a chemical mechanical polish (CMP) process, or using only a dry etching process, or using a combination of CMP and dry etching processes.

Figure 3L:
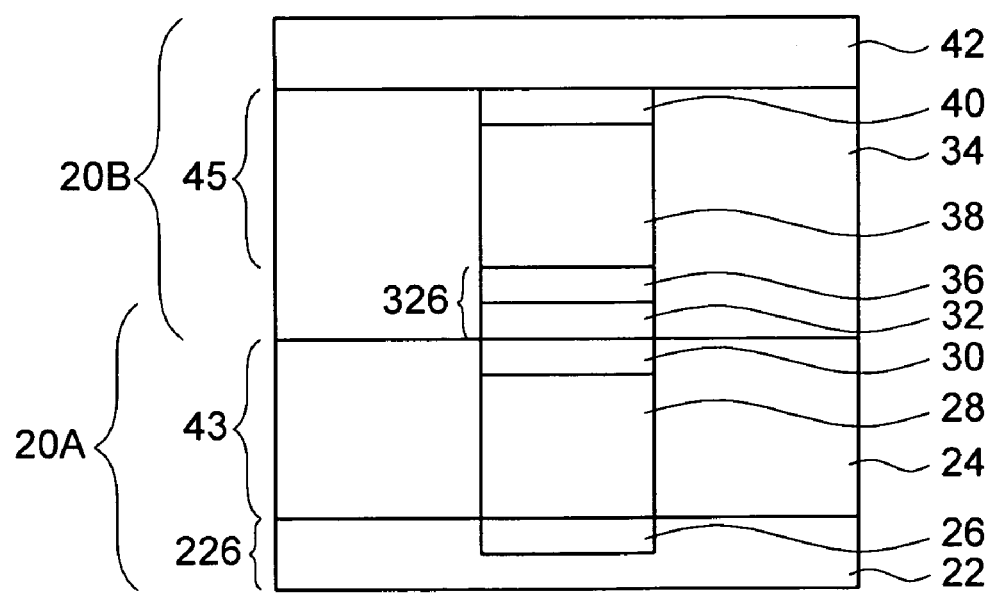

Referring to FIG. 3L, a second metal oxide layer 40 is formed on the second metal layer 38 by any known methods, such as thermal oxidation or plasma oxidation. The upper surfaces of the second oxide layer 34 and the second metal oxide layer 40 are coplanar. Subsequently, another first conductive layer 42 is then deposited over the second metal oxide layer 40, as shown in FIG. 3L. The second metal oxide layer 40 may include WOx, NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$, GeTi, SnMnTe, SbTe, $Pr_{1-x}Ca_xMnO_3$, or other like materials. Materials of the second metal oxide layer 40 and the first metal oxide layer 30 could be the same or different, depending on the device requirements in practical application. The first conductive line 42 is orthogonal to a top of the second conductive line 32. Also, the first conductive line 42 of the second memory cell 20B, opposite to the first conductive line 22 of the first memory cell 20A, may also include P-type conductive material.

Thus, the formation of 3D semiconductor structure of FIG. 2 (i.e. FIG. 3L), including the second memory cell 20B stacked on the first memory cell 20A, is accomplished.

According to the 3D semiconductor structure of the first embodiment (FIG. 2 and FIG. 3L), the first memory cell 20A comprises one memory element such as the first multi-layer unit 43 formed between the first conductive line 22 and the second conductive line 32, and the first multi-layer unit 43 includes the first metal layer 28 (formed above the first conductive line 22) and the first metal oxide layer 30 (formed on the first metal layer 28). Similarly, the second memory cell 20B comprises one memory element such as the second multi-layer unit 45 formed between the first conductive line 42 and the second conductive line 32, and the second multi-layer unit 45 includes the second metal layer 38 and the second metal oxide layer 40. The second conductive line 32 is formed between the first conductive lines 22 and 42, and shared by the first memory cell 20A and the second memory cell 20B when the 3D semiconductor structure is programming and erasing. Moreover, a diode element is preferably constructed into each memory cell. For example, the first conductive line 22 (ex. P-type) and the first doped region 26 (ex. N-type) function as a first diode 226 in the first memory cell 20A, and the second conductive line 32 (ex. P-type) and the second doped region 36 (ex. N-type) function as a second diode 326 in the second memory cell 20B.

Second Embodiment

Figure 4:
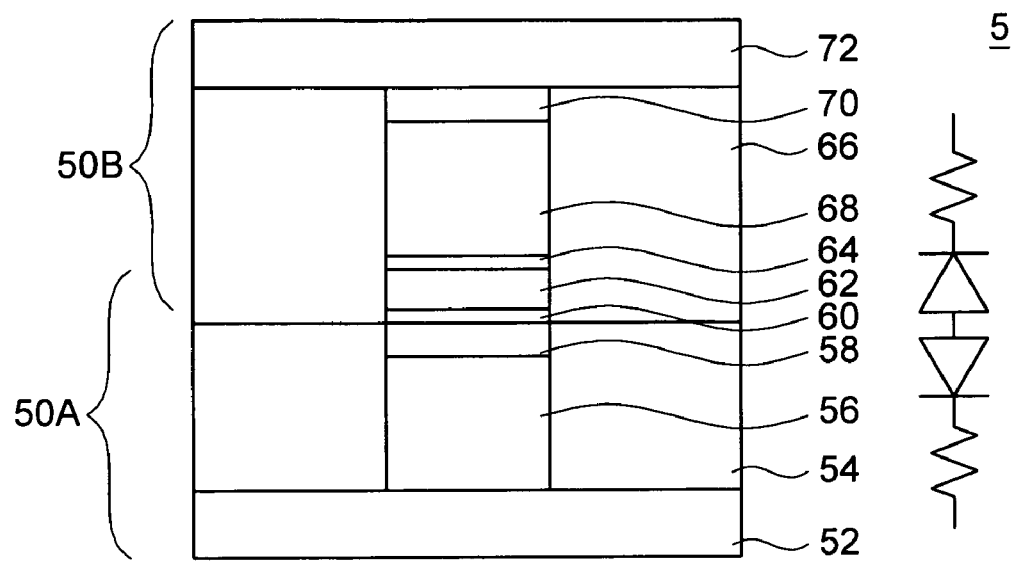
FIG. 4 schematically shows a cross-sectional view of a three-dimensional (3D) semiconductor structure according to the second embodiment of the present invention.

FIG. 4 schematically shows a cross-sectional view of a three-dimensional (3D) semiconductor structure according to the second embodiment of the present invention. As shown in FIG. 4, the 3D semiconductor structure 5 is constructed by vertically stacking at least two memory cells 50A and 50B. The structures of the first and second embodiments are similar, except the positions of the diode elements are slightly modified in the first and second memory cells 50A and 50B.

As shown in FIG. 4, the first memory cell 50A includes a first conductive line 52, a first metal layer 56, a first metal oxide layer 58, a first doped region 60, and a second conductive line 62 opposite to the first conductive line 52. The first conductive line 52 and the second conductive line 62 could be the P-type conductive lines. The first metal layer 56 is formed on the first conductive line 52, and the first metal oxide layer 58 is formed on the first metal layer 56. The first doped region 60, such as a N-doped region, is formed on the first metal oxide layer 58 and below the second conductive line 62. The second conductive line 62, which is orthogonal to a top of the first conductive line 52, is formed above the first doped region 60. Also, the P-type second conductive line 62 and the first N-doped region 60 function as a diode element for controlling the amounts and flowing direction of current when the first memory cell 50A is operated.

Similarly, the second memory cell 50B, stacked on the first memory cell 50A, includes the second conductive line 62, a second doped region 64, a second metal layer 68, a second metal oxide layer 70, and another first conductive line 72. The second doped region 64, such as a N-doped region, is formed on the second conductive line 62. The second metal layer 68 is formed on the second doped region 64, and the second metal oxide layer 70 is formed on the second metal layer 68. The first conductive line 72 of the second memory cell 50B, which is orthogonal to a top of the second conductive line 62, is formed on the second metal oxide layer 70. Also, the P-type second conductive line 62 and the second N-doped region 64 function as a diode element for controlling the amounts and flowing direction of current when the second memory cell 50B is operated.

According to the semiconductor structure 5 of FIG. 4 in the second embodiment, the first doped region 60 and the second doped region 64 are respectively formed below and above the second conductive line 62. The first metal oxide layer 58 and the second metal oxide layer 70 act as the memory elements while the first memory cell 50A and the second memory cell 50B are programming. Moreover, the second conductive line 62 is formed between the first conductive line 52 of the first memory cell 50A and the first conductive line 72 of the second memory cell 50B, as shown in FIG. 4. The programming of the first memory cell 50A is achieved by applying voltages on the first conductive line (ex. word line) 52 and the second conductive line (ex. bit line) 62. The programming of the second memory cell 20B is achieved by applying voltages on the first conductive line (ex. word line) 72 and the second conductive line (ex. bit line) 62. Similar to the structure of the first embodiment, the first and second memory cells 50A and 50B of the second embodiment share the second conductive line 62 during operation of the 3D semiconductor structure 5.

Furthermore, a memory device may include several repeat units of the semiconductor structure 2 arranged in a 3D matrix (i.e. several memory cells matrixed in the X-Y plane and any number of memory cells stacked along the Z-direction) while the structure of the second embodiment applied in practical application. It is further noted that the first conductive lines 52 and 72 could be P-type word lines, and the second conductive line 62 could be a common P-type bit line. Alternatively, the first conductive lines 52 and 72 could be P-type bit lines, and the second conductive line 62 could be a P-type word line. Operation of the memory cells and the common conductive lines thereof would be optionally determined according to the practical applications, and the present invention has no particular limitation herein.

The method of fabricating the 3D semiconductor structure 5 of FIG. 4 will now be explained with reference to FIG. 5A~FIG. 5J. FIG. 5A~FIG. 5J illustrate a method of fabricating the 3D semiconductor structure of the second embodiment in the present invention.

Figure 5A:
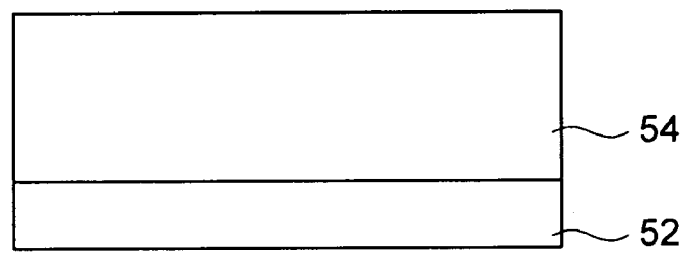
FIG. 5A~FIG. 5J illustrate a method of fabricating the 3D semiconductor structure of the second embodiment in the present invention.
Figure 5B:
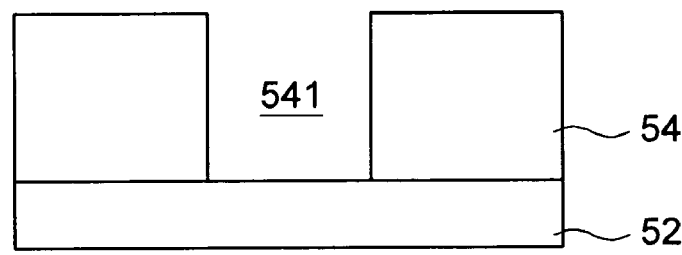

Referring to FIG. 5A, a first conductive line 52 on which an insulation layer such as a first oxide layer 54 has been formed is provided. The first conductive line 52 may include P-type conductive material. The first oxide layer 54 could be formed on the first conductive line 52 by any known deposition method. The first oxide layer 54 is then etched to expose partial area of the first conductive line 52 and form a hole 541 therein, as shown in FIG. 5B.

Figure 5C:
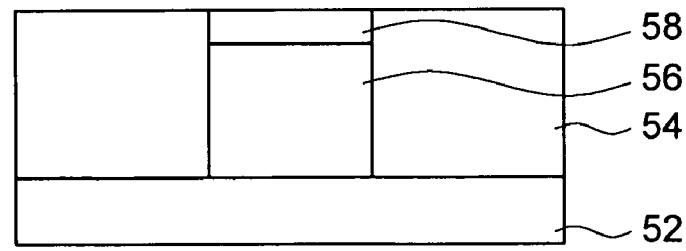

Referring to FIG. 5C, a conductive layer such as metal is deposited on the exposed area of the first conductive line 52 to fill in the hole 541. The conductive layer and the first oxide layer 54 are then planarized by using a chemical mechanical polish (CMP) process, or a dry etching process, or a combination thereof, to form a first metal layer 56. Next, a first metal oxide layer 58 is formed on the first metal layer 56 by thermal oxidation or plasma oxidation, wherein the upper surfaces of the first oxide layer 54 and the first metal oxide layer 58 are coplanar.

Figure 5D:
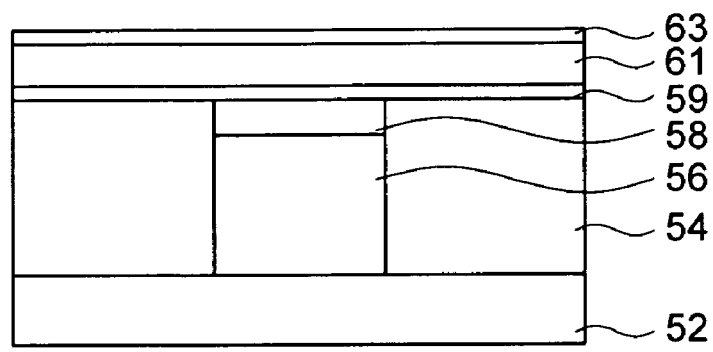
Figure 5E:
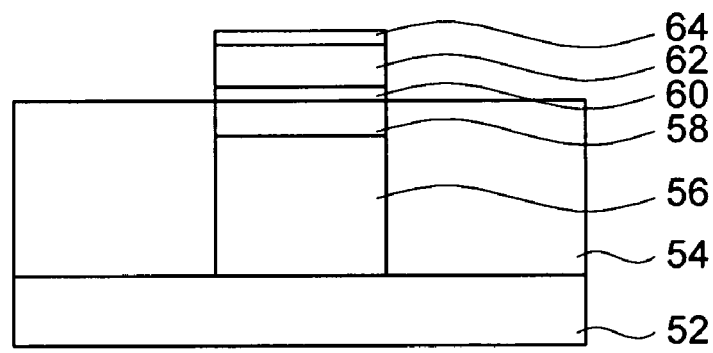

Referring to FIG. 5D and FIG. 5E, a doped-poly film 59, a conductive layer 61, and another doped-poly film 63 are sequentially deposited above the first metal oxide layer 58, and then patterned (ex. etched) to form a first doped region 60, a second conductive line 62 and a second doped region 64. The second conductive line 62 may include P-type conductive material, and two N-doped regions are exemplified as the first and second doped regions 60 and 64. Also, first doped region 60, the second conductive line 62 and the second doped region 64 are corresponding to (i.e. aligned with) the exposed area of the first conductive line 52 of FIG. 5B.

Figure 5F:
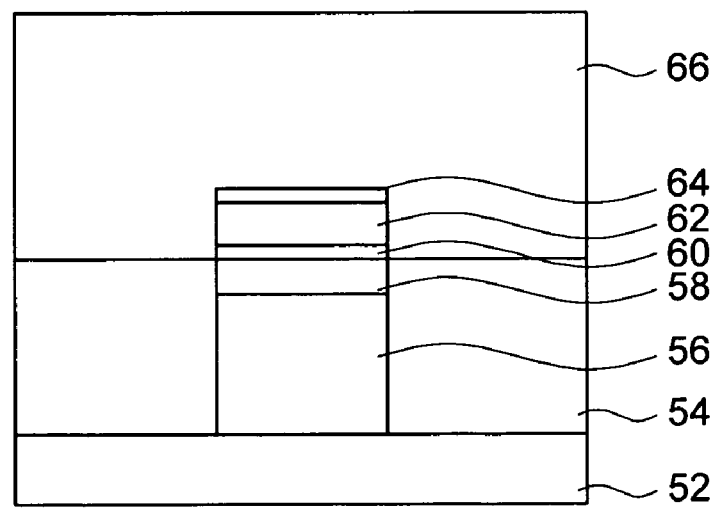
Figure 5G:
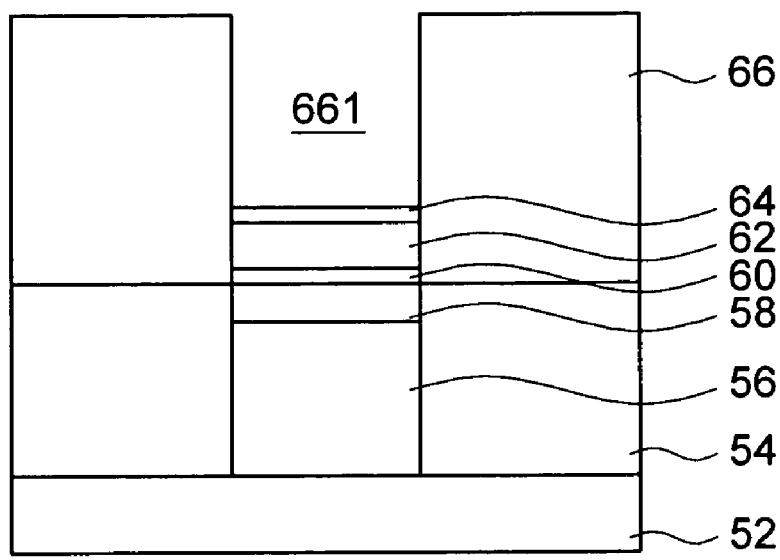

Referring to FIG. 5F, a second oxide layer 66 is deposited on the first oxide layer 54 and covers the first doped region 60, the second conductive line 62 and the second doped region 64. The second oxide layer 66 is then patterned (ex. by etching) to expose partial area of the second doped region 64 for forming a hole 661 therein, as shown in FIG. 5G.

Figure 5H:
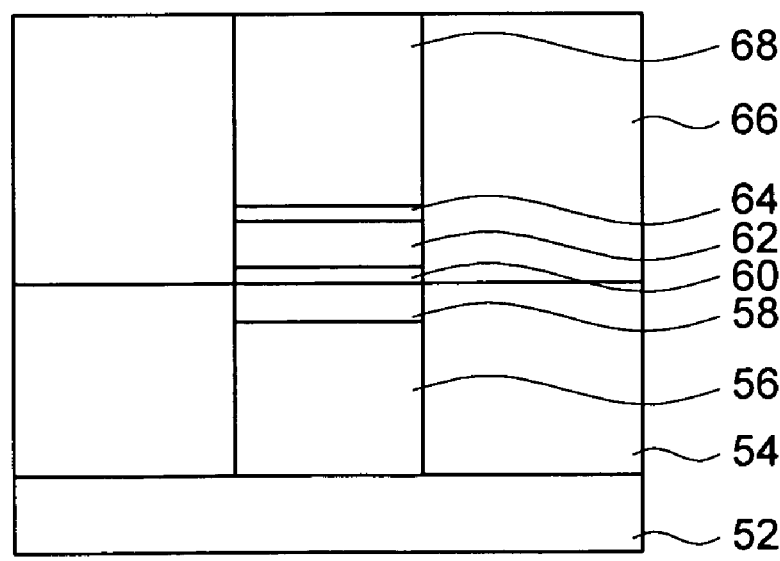

Referring to FIG. 5H, a conductive layer such as metal is deposited on the exposed area of the second doped region 64 to fill in the hole 661. The conductive layer and the second oxide layer 66 are then planarized, by CMP, etching or a combination thereof to form a second metal layer 68.

Figure 5I:
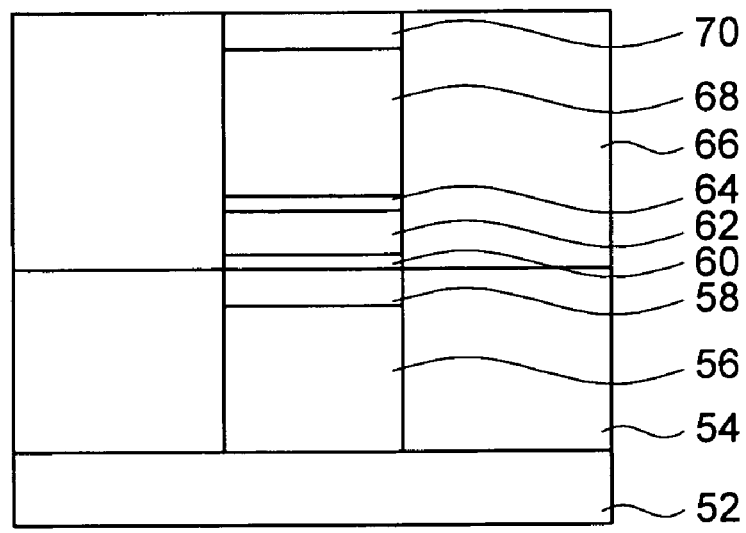
Figure 5J:
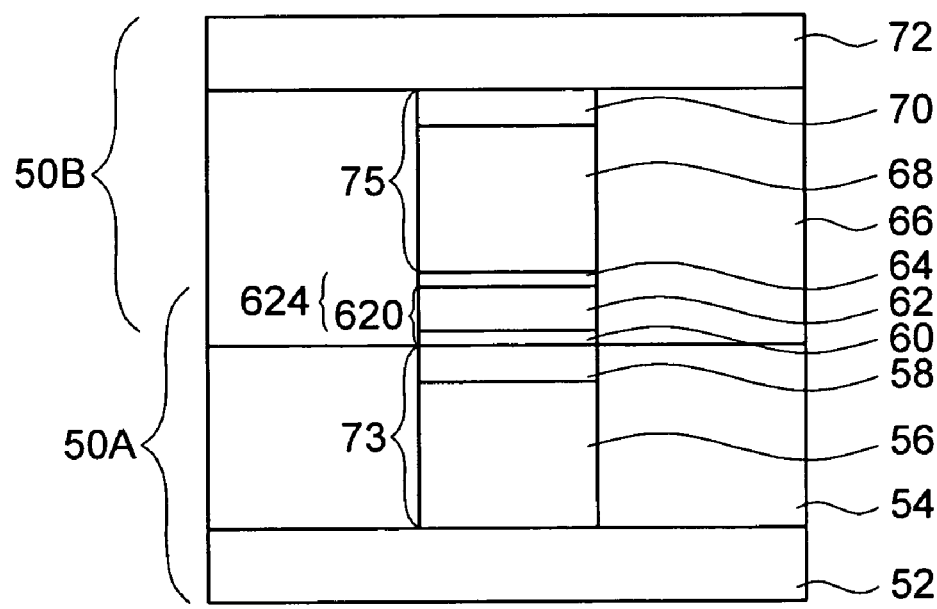

Referring to FIG. 5I, a second metal oxide layer 70 is formed on the second metal layer 68 by thermal oxidation, plasma oxidation, or other known methods. The upper surfaces of the second oxide layer 66 and the second metal oxide layer 70 are coplanar. Subsequently, another first conductive layer 72 is then deposited over the second metal oxide layer 70, as shown in FIG. 5J. The first conductive line 72 is orthogonal to a top of the second conductive line 62. Also, the first conductive line 72 of the second memory cell 50B, opposite to the first conductive line 52 of the first memory cell 50A, may also include P-type conductive material.

Thus, the formation of 3D semiconductor structure 5 of FIG. 4 (i.e. FIG. 5J), including the second memory cell 50B stacked on the first memory cell 50A, is accomplished.

According to the 3D semiconductor structure 5 of the second embodiment (FIG. 4 and FIG. 5J), the first memory cell 50A comprises one memory element such as the first multi-layer unit 73 (i.e. the first metal layer 56 and the first metal oxide layer 58) formed between the first conductive line 52 and the second conductive line 62. Similarly, the second memory cell 50B comprises one memory element such as the second multi-layer unit 75 (i.e. the second metal layer 68 and the second metal oxide layer 70) formed between the first conductive line 72 and the second conductive line 62. The second conductive line 62 is formed between the first conductive lines 52 and 72, and shared by the first memory cell 50A and the second memory cell 50B during programming operation. Similar to the structure of the first embodiment, a diode element is preferably constructed into each memory cell of the second embodiment. The second conductive line 62 (ex. P-type) and the first doped region 60 (ex. N-type) function as a first diode 620 of the first memory cell 50A, while the second conductive line 62 (ex. P-type) and the second doped region 64 (ex. N-type) function as a second diode 624 of the second memory cell 50B.

Figure 6:
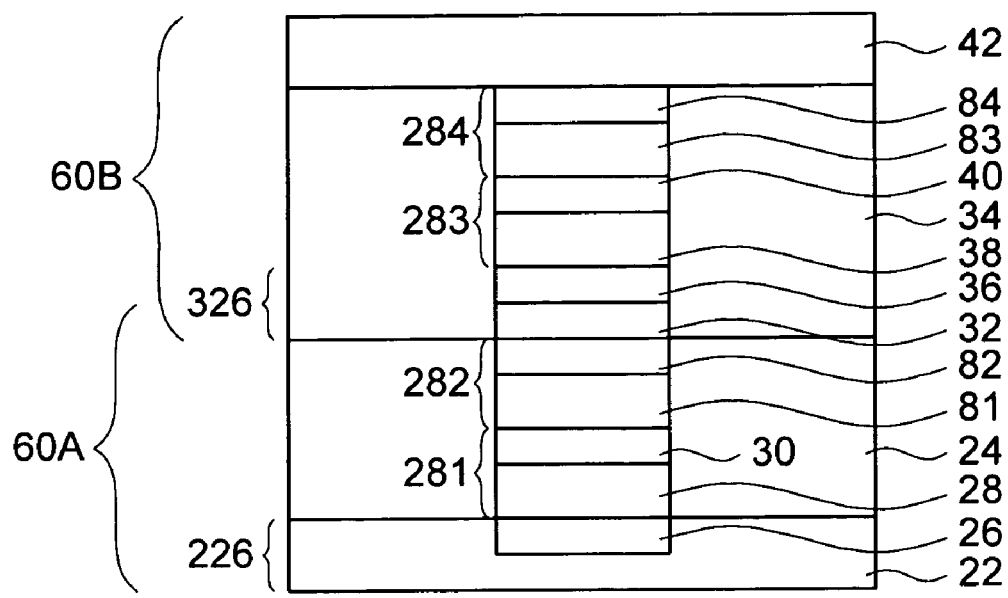
FIG. 6 schematically shows a cross-sectional view of a three-dimensional (3D) semiconductor structure according to the third embodiment of the present invention.

Each Memory Cell of 3D Semiconductor Structure Including a Plurality of Memory Elements Third Embodiment FIG. 6 schematically shows a cross-sectional view of a three-dimensional (3D) semiconductor structure according to the third embodiment of the present invention. The 3D semiconductor structure 6 of the third embodiment is similar to the 3D semiconductor structure 2 of the first embodiment, except that each memory cell of the third embodiment includes plural memory elements so as to fabricate a 3D semiconductor structure with multi-level cells (MLC, i.e. each memory cell capable of storing a plurality of bits). The elements of FIG. 6 identical to the elements of FIG. 2 are designated with the same reference numbers. Also, the method of fabricating the semiconductor structure 6 of the third embodiment could be referred to the description in the first embodiment.

According to the 3D semiconductor structure 6 of the third embodiment (FIG. 6), the first memory cell 60A comprises at least two memory elements (i.e. two multi-layer units), including a first multi-layer unit 281 (i.e. the first metal layer 28 and the first metal oxide layer 30) and a second multi-layer unit 282 (i.e. another first metal layer 81 and another first metal oxide layer 82), formed between the first conductive line 22 and the second conductive line 32. Thus, the first multi-layer unit 281 and the second multi-layer units 282 are stacked between the second conductive line 32 and the first doped region 26, and each multi-layer unit comprises a first metal layer and a first metal oxide layer formed on the first metal layer.

Similarly, the second memory cell 60B comprises at least two memory elements (i.e. two multi-layer units), including a third multi-layer unit 283 (i.e. the second metal layer 38 and the second metal oxide layer 40) and a fourth multi-layer unit 284 (i.e. another second metal layer 83 and another second metal oxide layer 84) formed between the first conductive line 42 and the second conductive line 32. Thus, the third multi-layer unit 283 and the fourth multi-layer unit 284 are stacked between the second doped region 36 and the first conductive line 42 of the second memory cell 60B, and each multi-layer unit comprises a second metal layer and a second metal oxide layer formed on the second metal layer.

Similar to the structure of the first embodiment, the second conductive line 32 is formed between the first conductive lines 22 and 42, and shared by the first memory cell 60A and the second memory cell 60B during programming operation according to the third embodiment. Also, the first conductive line 22 (ex. P-type) and the first doped region 26 (ex. N-type) function as a first diode 226 of the first memory cell 60A, while the second conductive line 32 (ex. P-type) and the second doped region 36 (ex. N-type) function as a second diode 326 of the second memory cell 60B.

A multi-level cell is capable of storing more than a single bit of information. The 3D semiconductor structure 6 of FIG. 6 exemplifies a structure with multi-level cells (MLC), wherein the first memory cell 60A comprising two memory elements (i.e. the first multi-layer unit 281 and the second multi-layer unit 282) is capable of storing 2 bits of information, and the second memory cell 60B comprising two memory elements (i.e. the third multi-layer unit 283 and the fourth multi-layer unit 284) is capable of storing 2 bits of information. Accordingly, the memory cells of the 3D semiconductor structure 6 of FIG. 6 defines four logic states, "00", "01", "10" and "11".

Fourth Embodiment

Figure 7:
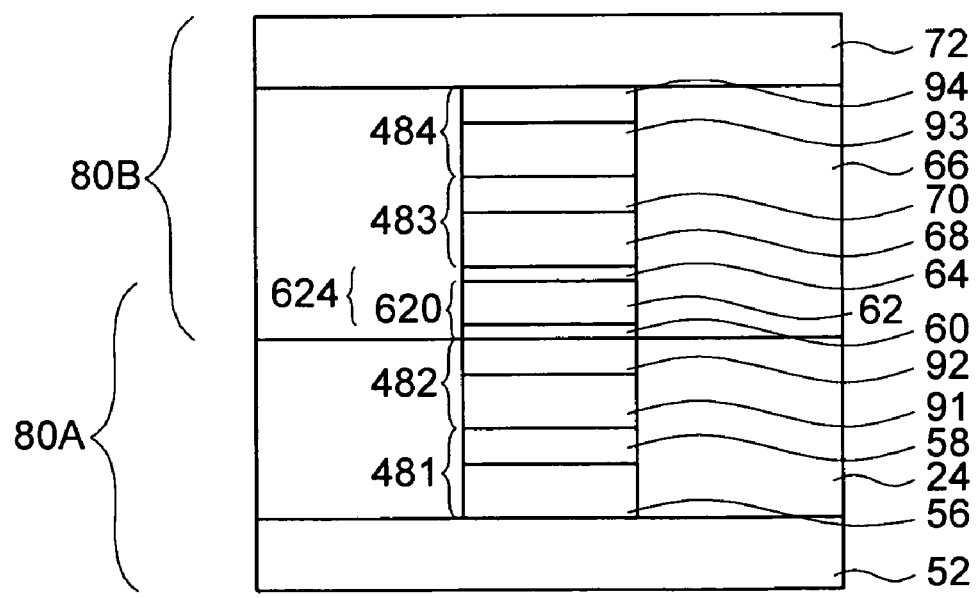
FIG. 7 schematically shows a cross-sectional view of a three-dimensional (3D) semiconductor structure according to the fourth embodiment of the present invention.

FIG. 7 schematically shows a cross-sectional view of a three-dimensional (3D) semiconductor structure according to the fourth embodiment of the present invention. The 3D semiconductor structure 8 of the fourth embodiment is similar to the 3D semiconductor structure 5 of the second embodiment, except that each memory cell of the fourth embodiment includes plural memory elements so as to fabricate a 3D semiconductor structure with multi-level cells (MLC, i.e. each memory cell capable of storing a plurality of bits). The elements of FIG. 7 identical to the elements of FIG. 4 are designated with the same reference numbers. Also, the method of fabricating the semiconductor structure 8 of the fourth embodiment could be referred to the description in the second embodiment.

According to the 3D semiconductor structure 8 of the fourth embodiment (FIG. 7), the first memory cell 80A comprises at least two memory elements (i.e. two multi-layer units), including a first multi-layer unit 481 (i.e. the first metal layer 56 and the first metal oxide layer 58) and a second multi-layer unit 482 (i.e. another first metal layer 91 and another first metal oxide layer 92) formed between the first conductive line 52 and the second conductive line 62. Thus, the first multi-layer unit 481 and the second multi-layer units 482 are stacked between the first conductive line 52 and the first doped region 60, and each multi-layer unit comprises a first metal layer and a first metal oxide layer formed on the first metal layer.

Similarly, the second memory cell 80B comprises at least two memory elements (i.e. two multi-layer units), including a third multi-layer unit 483 (i.e. the second metal layer 68 and the second metal oxide layer 70) and a fourth multi-layer unit 484 (i.e. another second metal layer 93 and another second metal oxide layer 94) formed between the first conductive line 72 and the second conductive line 62. Thus, the third multi-layer unit 483 and the fourth multi-layer unit 484 are stacked between the second doped region 64 and the first conductive line 72 of the second memory cell 80B, and each multi-layer unit comprises a second metal layer and a second metal oxide layer formed on the second metal layer.

Similar to the semiconductor structure 5 of the second embodiment, the second conductive line 62 is formed between the first conductive lines 52 and 72, and shared by the first memory cell 80A and the second memory cell 80B during programming operation according to the fourth embodiment. Also, the second conductive line 62 (ex. P-type) and the first doped region 60 (ex. N-type) function as a first diode 620 of the first memory cell 80A, while the second conductive line 62 (ex. P-type) and the second doped region 64 (ex. N-type) function as a second diode 624 of the second memory cell 80B.

A multi-level cell is capable of storing more than a single bit of information. The 3D semiconductor structure 7 of FIG. 7 exemplifies a structure with multi-level cells (MLC), wherein the first memory cell 80A comprising two memory elements (i.e. the first multi-layer unit 481 and the second multi-layer unit 482) is capable of storing 2 bits of information, and the second memory cell 80B comprising two memory elements (i.e. the third multi-layer unit 483 and the fourth multi-layer unit 484) is capable of storing 2 bits of information. Accordingly, the memory cells of the 3D semiconductor structure 7 of FIG. 7 defines four logic states, "00", "01", "10" and "11".

While the invention has been described by way of example and in terms of the preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) semiconductor structure, comprising at least:
   a first cell, comprising:
      a first conductive line;
      a second conductive line; and
      a first doped region; and
   a second cell, stacked on the first cell, and the second cell comprising:
      another first conductive line, opposite to the first conductive line of the first cell;
      the second conductive line, formed between said two first conductive lines of the first and second cells, and the first and second cells sharing the second conductive line when the 3D semiconductor structure is programming and erasing; and
      a second doped region, the first and the second doped regions respectively directly contacting a bottom and a top of the second conductive line;
      wherein the first doped region and the second conductive line form a first diode of the first memory cell, and the second doped region and the second conductive line form a second diode of the second memory cell.

2. The 3D semiconductor structure according to claim 1, wherein the first cell further comprises a first multi-layer unit formed between the first and the second conductive lines, and the first multi-layer unit comprises a first metal layer formed on the first conductive line and a first metal oxide layer formed on the first metal layer.

3. The 3D semiconductor structure according to claim 1, further comprises:
   a first metal layer, formed on the first conductive line of the first cell;

a second metal layer, formed on the second doped region of the second cell;

a first metal oxide layer, formed on the first metal layer of the first cell; and a second metal oxide layer, formed on the second metal layer of the second cell;

wherein the first doped region is formed on the first metal oxide layer of the first cell, and said first conductive line of the second cell is formed on the second metal oxide layer of the second cell.

4. The 3D semiconductor structure according to claim 1, wherein the first conductive lines are a first and a second word lines, and the second conductive line is a bit line.

5. The 3D semiconductor structure according to claim 1, wherein the first conductive lines are a first and a second bit lines, and the second conductive line is a word line.

6. A three-dimensional (3D) semiconductor structures, comprising at least:
   a first memory cell, comprising:
   a first bit line;
   a word line; and
   a first doped region; and
   a second memory cell, stacked on the first memory cell, and the second memory cell comprising:
      a second bit line, opposite to the first bit line of the first memory cell;
      the word line, formed between the first bit line of the first memory cell and the second bit line of the second memory cell; and
      a second doped region, the first and the second doped regions respectively directly contacting a bottom and a top of the word line;
   wherein the first bit line of the first memory cell and the second bit line of the second memory cell shares the word line disposed therebetween when the 3D semiconductor structure is programming and erasing;
   wherein the first doped region and the word line form a first diode of the first memory cell, while the second doped region and the word line form a second diode of the second memory cell.

7. A three-dimensional (3D) semiconductor structures, comprising at least:
   a first memory cell, comprising:
   a first word line;
   a bit line; and
   a first doped region; and
   a second memory cell, stacked on the first memory cell, and the second memory cell comprising:
      a second word line, opposite to the first word line of the first memory cell; and
      the bit line, formed between the first word line of the first memory cell and the second word line of the second memory cell; and
      a second doped region, the first and the second doped regions respectively directly contacting a bottom and a top of the bit line;
   wherein the first word line of the first memory cell and the second word line of the second memory cell shares the bit line disposed therebetween when the 3D semiconductor structure is programming and erasing
   wherein the first doped region and the bit line form a first diode of the first memory cell, while the second doped region and the bit line form a second diode of the second memory cell.

* * * * *